(12) United States Patent
Iancu

(10) Patent No.: US 7,535,291 B2
(45) Date of Patent: May 19, 2009

(54) AM DEMODULATOR

(75) Inventor: Daniel Iancu, Pleasantville, NY (US)

(73) Assignee: Sandbridge Technologies, Inc., Tarrytown, NY (US)

(*) Notice: Subject to any disclaimer, the term of this patent is extended or adjusted under 35 U.S.C. 154(b) by 386 days.

(21) Appl. No.: 11/272,771

(22) Filed: Nov. 15, 2005

(65) Prior Publication Data

US 2006/0063507 A1   Mar. 23, 2006

Related U.S. Application Data

(62) Division of application No. 10/400,506, filed on Mar. 28, 2003, now Pat. No. 7,076,233.

(51) Int. Cl.
*H03D 1/18* (2006.01)
*H03D 1/04* (2006.01)
*H03D 1/06* (2006.01)

(52) U.S. Cl. .................. 329/363; 455/337; 375/320

(58) Field of Classification Search .......... 329/347, 329/358, 363; 375/320; 455/337
See application file for complete search history.

(56) References Cited

U.S. PATENT DOCUMENTS

| 5,278,837 | A | 1/1994 | Kelley |
| 5,375,146 | A | 12/1994 | Chalmers |
| 6,512,472 | B1 | 1/2003 | Smith et al. |
| 6,560,294 | B1* | 5/2003 | Gatherer ............... 375/261 |
| 7,092,465 | B2* | 8/2006 | Hendrix et al. ......... 375/350 |

\* cited by examiner

*Primary Examiner*—Robert Pascal
*Assistant Examiner*—James E Goodley
(74) *Attorney, Agent, or Firm*—Barnes & Thornburg LLP

(57) ABSTRACT

An amplitude modulation receiver including an antenna for receiving a signal and an input filter connected to the antenna. A variable gain amplifier is connected to the input filter and is responsive to a gain control signal. An A/D converter is connected to the variable gain amplifier and is responsive to a sampling signal and provides a sampled digital signal. A D/A converter receives a demodulated signal and provides an analog output signal. A controller receives and demodulates the sampled digital signal from the A/D converter, generates the gain control signal for the variable gain amplifier, generates the sampling signal for the A/D converter, and provides the demodulated signal to the D/A converter. The demodulation and generation of the gain control signal and the sampling signal are performed in software.

10 Claims, 3 Drawing Sheets

AM DEMODULATOR

The present application is a division of U.S. patent application Ser. No. 10/400,506 filed Mar. 28, 2003 now U.S. Pat. No. 7,076,233, the benefit of which is claimed and which is incorporated herein by reference.

BACKGROUND AND SUMMARY OF THE INVENTION

The present invention relates generally to AM receivers and more specifically to a receiver capable of software implementation of varies elements in AM receivers.

Despite the fact that the AM receiver is almost a century old the software radio implementation is still cost prohibitive. Currently, AM receivers are implemented in hardware, employing AM/FM chips at record low cost. A simplified block diagram of a conventional AM receiver is illustrated in FIG. 1. However, in a multi protocol communication hand held device, the hardware implementation becomes less attractive due to extra cost and PC board area consumed. The most attractive alternative for multi protocol communication devices is provided by the Software Defined Radio (SDR). The SDR has the ability to execute multiple communication protocols in the same processor but requires a different RF front end for each of them. As the processor capabilities evolve to higher MIPS, the border between analog and digital components moves closer to the antenna.

The hardware architecture of the present AM receiver uses fewer hardware components and allows an efficient software implementation by reducing the MIPS required. It provides both flexibility and low power consumption. A group of the AM receiver functions, including filtering and demodulation, are implemented in software.

The amplitude modulation receiver includes an antenna for receiving a signal and an input filter connected to the antenna. A variable gain amplifier is connected to the input filter and is responsive to a gain control signal. An A/D converter is connected to the variable gain amplifier, is responsive to a sampling signal and provides a sampled digital signal. A D/A converter receives a demodulated digital signal and provides an analogue output signal. A controller receives and demodulates the sampled digital signal from the A/D converter, generates the gain control signal for the variable gain amplifier, generates the sampling signal for the A/D converter, and provides the demodulated signal to the D/A converter.

The controller may be a multi-thread processor performing the demodulation and signal generation tasks in parallel.

The controller provides a sampling signal to a phase locked loop whose output provides the sampling signal to the A/D converter. The sampling signal from the controller is provided to a voltage control oscillator of the phase locked loop. The controller controls the generation of a variable sampling signal whose rate is coherent with the carrier frequency of the received signal.

The demodulator of the AM receiver is implemented in software which includes an input filter for filtering an input signal; a decimator and integrator demodulator for demodulating the filtered input signal; and an output filter for filtering the demodulated signal. The demodulator and the input filter are tuned to the carrier frequency of the input signal and the output filter is tuned to the decimated carrier frequency of the input signal. Coefficients of the filters for each carrier frequency are stored in the demodulator. The filtered signal is multiplied by a demodulation signal at a carrier frequency, integrated over a carrier cycle period and then decimated.

These and other aspects of the present invention will become apparent from the following detailed description of the invention, when considered in conjunction with accompanying drawings.

DETAILED DESCRIPTION OF THE PREFERRED EMBODIMENTS

The present receiver is a reduced MIPS software implementation of a conventional AM receiver. By using a variable sampling rate scheme such that the sampling rate is coherent with the received carrier frequency, the complexity of several AM receiver blocks, associated with the demodulation process, including the down conversion block, can be significantly reduced and executed in software. The benefit of the reduced complexity AM receiver translates in low cost as well as low power consumption, thereby enabling its integration into hand held devices such as mobile phones, PDAs or multi-protocol communication devices. In the present architecture, all functions associated with the AM receiver, including most of the filtering and the demodulation, are executed in software, for example using two threads of the Sandbridge Technologies multithreaded SB9600 processor.

Figure 1:
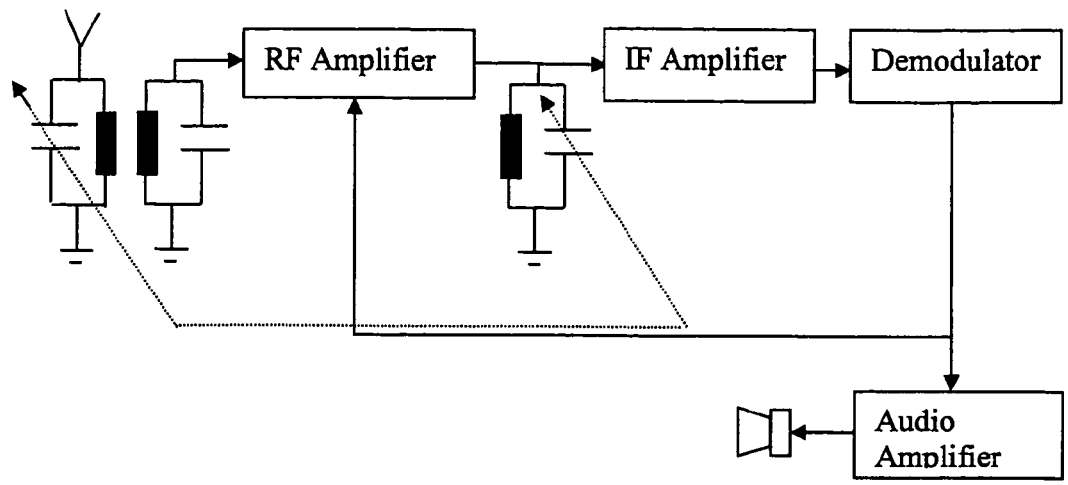
FIG. 1 is a block diagram of a prior art AM receiver implemented in hardware.
Figure 2:
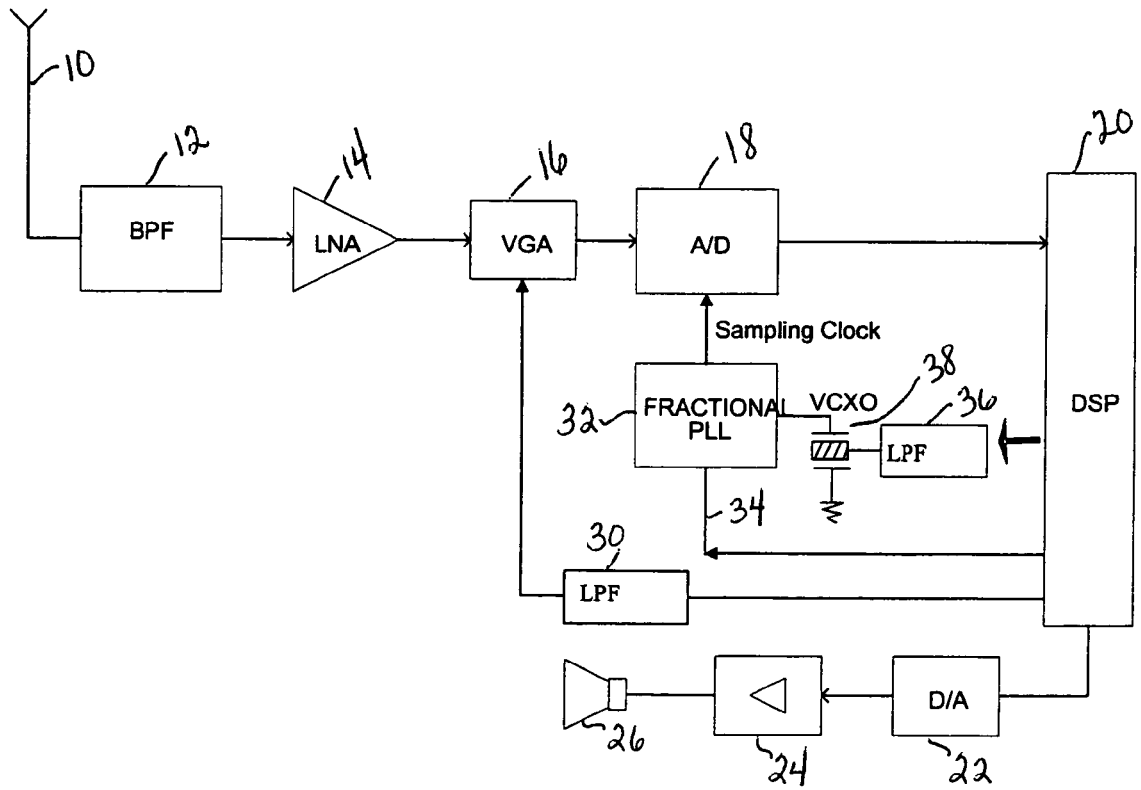
FIG. 2 is a block diagram of an AM receiver according to the principles of the present invention.

Hardware components of an AM receiver designed for software implementation is illustrated in FIG. 2. The signal received on antenna 10 is connected to a band pass filter 12. The output of the band pass filter 12 is provided to a variable gain amplifier 16 via a low noise amplifier 14. The output of the variable gain amplifier 16 is provided to analog to digital (A/D) converter 18. The digital signal is then provided to controller 20, shown as a digital signal processor (DSP). The received signal is demodulated and provided as an output signal to digital to analog (D/A) converter 22. The analog output is then amplified at 24 and provided to an audio device 26. The controller 20 also provides the gain control for the variable gain amplifier 16 via low pass filter (LPF) or integrator 30.

The sampling rate of the A/D converter 18 is also controlled by the controller 20. A fractional phase locked loop (PLL) 32 receives control signals from the controller 20, which determines the sampling clock. The first output from the DSP controller 20 is provided at 34 to the fractional PLL 32. A second signal is provided via low pass filter (LPF) or integrator 36 to the voltage control crystal oscillator (VCXO) 38, which is connected to the fractional PLL 32. The signal provided on line 34 to the fractional PLL 32 is a gross frequency signal, which is fine-tuned by the signal provided over integrator 36 to the voltage control crystal oscillator 38. The controller 20 fine-tunes the sampling clock or rate of the A/D converter 18 to be coherent with the carrier frequency of the received signal. This allows efficient software implementation of the demodulator and the control of voltage gain amplifier 16 and the A/D converter 32.

Figure 3:
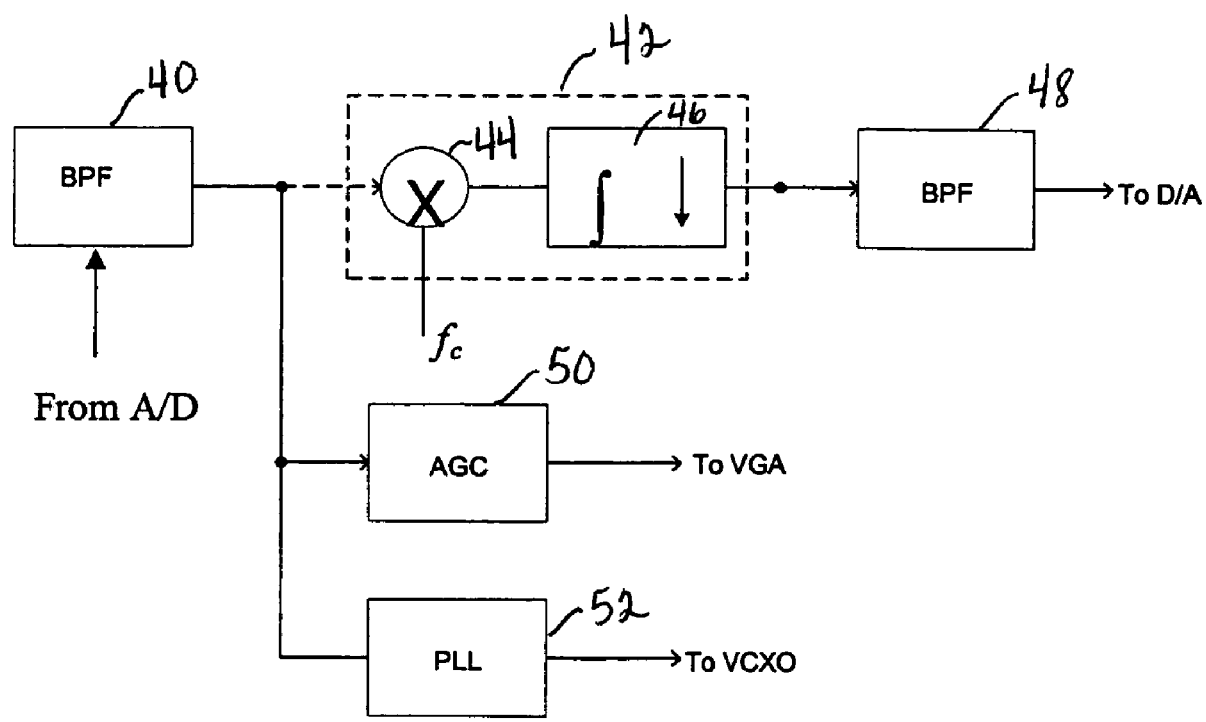
FIG. 3 is a block diagram of a software implementation of the control portion of FIG. 2 incorporating the principles of the present invention.

The software implementation performed in the controller 20 is illustrated in FIG. 3. The input signal from the A/D converter 18 is provided through an input filter 40. This output signal is provided to demodulator 42, whose output is again filtered by an output filter 48. The output of output filter 48 is then provided to the D/A converter 22. The demodulator 42 is illustrated as a decimation integration filter. It includes a multiplier portion 44 and an integration/decimation portion 46. The input filter 40 and the demodulator 42 are all tuned to the carrier frequency of the received signal. The output filter 48 is tuned to the decimated carrier frequency of the received signal. The coefficients for both of the filters are stored in memory, for example a non volatile memory, for each carrier frequency.

As an example, the sampled signal from the A/D converter 18, at sampling frequency eight times the carrier, is filtered using a two poles two zeros band pass filter 40, centered at the carrier frequency with 3 dB attenuation at 5 KHz bandwidth. The sampling rate may be at different multipliers of the carrier (for example, 4 or 16). The filtered signal is then multiplied with the cosine sampled signal ($f_c$) by multiplier/decimator 44 and integrated over eight samples. After integration, the data goes through a 1:16 decimation. The decimation ratio can be other ratios (for example, 1:8 or 1:32). Next, filtering using a 96 tap 80 dB FIR low pass filter 48, rescaling and DC removal. Finally, the data is sent to the D/A converter 22. The filter may be a different number of taps, like 128 for example.

The sampled digital signal from the input filter 40 is also provided to an automatic gain control (AGC) software portion 50, which provides an output through LFP 30 to the variable gain amplifier 16. The sampled digital signal from input filter 40 is also provided to a phase locked loop (PLL) software portion 52. This produces the fine sampling signal to the variable control crystal oscillator 38 through LPF 36.

Examples of algorithms used to implement the demodulation portion of FIG. 3 are as follows:

The AM composite signal can be viewed as a superposition of N in band carriers each modulated by a modulation signal $\phi_k(t)$. If multipath is ignored, the AM composite function can be written as:

$$s(t) = \mathrm{Re}\left[\sum_i^N \varphi_i(t) e^{-jw_i t}\right] + n(t) \quad (1)$$

where n(t) is AWGN, N(0, σ), mostly coming from the receiver front end.

Using a rectangular windowing function, equation (1) can be rewritten as a sum of the time windowed segments:

$$s(t) = \sum_{m=-\infty}^{+\infty} g(t - mT_c) \mathrm{Re}\left[\sum_i^N \varphi_i(t) e^{-jw_i t}\right] + n(t) \quad (2)$$

where: $g(t - mT_c) = \sigma(t - mT_c)\sigma[(m+l)T_c - t]$ and $\sigma(t) =$ $$\begin{cases} 1 \text{ for } t \geq 0 \\ 0 \text{ for } t < 0 \end{cases} \text{ is the unit step}$$

function performing the windowing.

First, the AM composite signal of equation (1) is band pass filtered. Without loosing generality, the rectangular pass band filter is centered at the carrier frequency $f_c$, with out of band attenuation α. Next, the filtered signal is segmented as in equation (2) and multiplied with a demodulation function of $f_c$, $$d(t) = s(t)\mathrm{Re}[e^{-jw_k t}] = \sum_{m=-\infty}^{+\infty} g(t - mT_c) \quad (3)$$

$$\left[\varphi_k(t)\cos^2 w_k t + \alpha\left(\sum_{i \neq k}^N \varphi_i(t)\cos w_i t \cdot \cos(w_k(t)) + n(t)\cos(w_k(t))\right)\right]$$

Multiplying equation (3) by a windowing function $g(t-lT_c)$ to segment the demodulated segments and integrating over a carrier cycle period, with the assumption that $\phi_k(t)$ is constant over a cycle period $T_c$, it follows:

$$\int_{-mT_c}^{(m+1)T_c} d(t)g(t - lT_c)dt = \int_{-mT_c}^{(m+1)T_c} g(t - lT_c)s(t)\mathrm{Re}[e^{-jw_i t}] = \quad (4)$$

$$\underbrace{\int_{-mT_c}^{(m+1)T_c}\left[\sum_{m=-\infty}^{+\infty} g(t-mT_c)g(t-lT_c)\right]\left[\varphi_k(t)\cos^2 w_k t + \alpha\left(\sum_{i \neq k}^N \varphi_i(t)\cos w_i t \cdot \cos(w_k(t)) + n(t)\cos(w_k(t))\right)\right]dt}_{I}$$

After some simple calculations, the integral in equation (4), becomes:

$$I = \begin{cases} 0 \text{ for } m \neq l \\ \varphi_k^{(l)}\int_{-lT_c}^{(l+1)T_c}\cos^2 w_k t \cdot dt + \frac{\alpha\varphi_k^{(l)}}{2}\int_{-lT_c}^{(l+1)T_c}\sum_{i \neq k}^N[\cos(w_i - w_k)t + \cos(w_i + w_k)t]dt + \alpha\int_{-lT_c}^{(l+1)T_c}n(t)\cos w_k t \cdot dt \\ \text{for } m = l \end{cases} \quad (5)$$

In the above expression (5) the second integral will vanish after low pass filtering at the 5 KHz cut off frequency. The third integral represents the left over noise after filtering and integration is negligible and it can be further ignored. The final expression for I will be:

$$I = \begin{cases} 0 & \text{for } m \neq l \\ \dfrac{T_c}{2}\varphi_k^{(l)} & \text{for } m = l \end{cases}$$

After summation over all $l \in (-\infty, +\infty)$ and, scale with $2/T_c$, the sampled version of the modulation function reads:

$$\varphi_k(\tau) = \varphi_k[nT_c] \cong \frac{T_c}{2}\sum_{l=-\infty}^{+\infty} \varphi_k^{(l)} \Delta[(l-m)T_c] \qquad (6)$$

where: $\Delta[(l-m)T_c] = g(t-lT_c)g(t-mT_c)$ is the Delta or windowing function.

Figure 4:
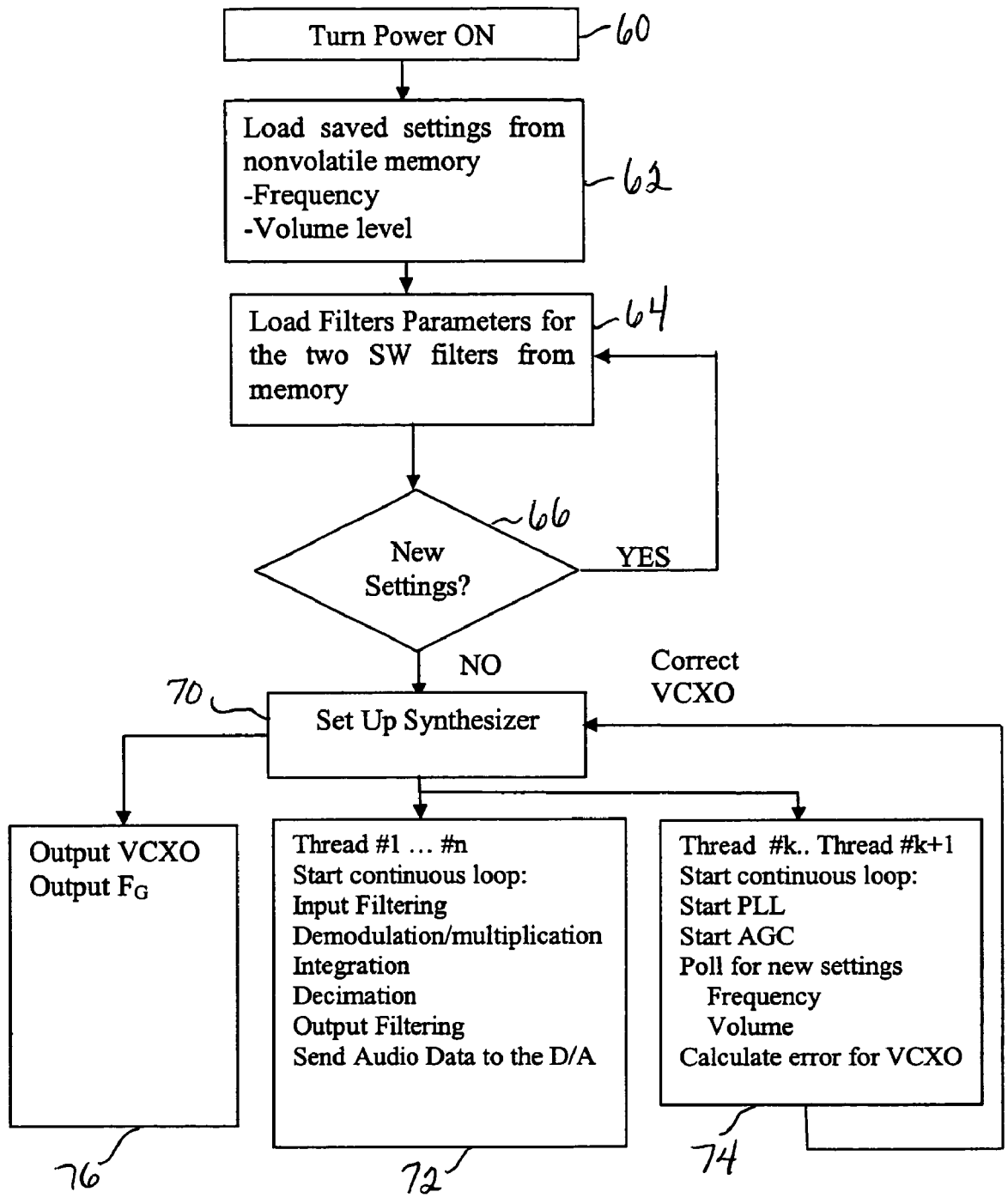
FIG. 4 is a flow chart of the software implementation of FIG. 3.

Preferably, the controller 20 is a multi-thread processor capable of executing the software programs in parallel. Such a processor, which is available from Sandbridge Technologies, Inc., further enhances the efficiency of the software. FIG. 4 represents a flow chart as an example of thread allocation of the different software blocks described above. As illustrated in FIG. 4, at power turn on 60, the settings from the non-volatile memory (for example, frequency and volume levels) are loaded at 62. Also, the filter parameters for the two software filters 40 and 48 are loaded from memory at 64. A determination is made at 66 whether the settings are new. If they are, then new filter parameters are loaded. If they are not new, the synthesizer of FIG. 3 is then set up at 70.

The software block for the input filter 40, the demodulator 42 and the output filter 48 are illustrated in Box 72. The following continuous loops are set up: (1) input filtering; (2) multiplication; (3) integration; (4) decimation; (5) output filtering; and (6) sending audio data to the D/A converter 22. The second group of threads is illustrated in Box 74. The following continuous loops are set up: (1) start the phase locked loop 52; (2) start the automatic gain control 50; (3) poll for new settings of frequency and volume; and (4) calculate the error for the voltage control oscillator 38 based on the phased locked loop 52 results. The output of the VCXO error is provided back to the set up synthesizer step 70. This provides the input through the integrator 36 to the voltage control crystal oscillator 38.

Box 76 indicates the outputs to the sampling circuit from the set up synthesizer 70. One of the outputs is the gross frequency $F_G$ for the fractional PLL 32. The gross frequency $F_G$ is from the loaded settings of frequency. The other output is VCXO for the voltage control oscillator 38, which has been corrected in the routines of Box 74.

Although the present invention has been described and illustrated in detail, it is to be clearly understood that this is done by way of illustration and example only and is not to be taken by way of limitation. The scope of the present invention is to be limited only by the terms of the appended claims.

What is claimed:

1. A demodulator for an amplitude modulation receiver, which comprises:
   an input filter for filtering an input signal;
   a decimator and integrator demodulator for demodulating the filtered input signal; and
   an output filter for filtering the demodulated signal, wherein:
   the filtered input signal s(t) is segmented by a windowing function $g(t-mT_c)$, where $T_c$ is a cycle time period;
   the segments of the filtered input signal s(t) are multiplied by the carrier frequency $w_k$, which produces demodulated segments d(t);
   the demodulated segments d(t) are segmented by a windowing function $g(t-lT_c)$,
   the segmented demodulated signals d(t) are integrated over the cycle period $T_c$, every period; and
   the integrated demodulated segments are summed and filtered by the output filter, which produces the modulation function $\phi_k[nT_c]$.

2. The demodulator according to claim 1, wherein coefficients of the filters for each carrier frequency are stored in the demodulator.

3. The demodulator according to claim 1, wherein the input and output filters filter the input signal and the integrated demodulated signal respectively to band pass about the carrier frequency.

4. The demodulator according to claim 1, wherein the demodulator is a multi-thread processor implementing the functions of the input filtering, decimation, integration and output filtering in parallel.

5. The demodulator according to claim 1, wherein the decimator and integrator demodulator decimates the integrated demodulated signal through a predetermined decimation ratio before being forwarded to the output filter.

6. The demodulator according to claim 5, wherein the predetermined decimation ratio is a 1:8 ratio.

7. The demodulator according to claim 5, wherein the predetermined decimation ratio is a 1:16 ratio.

8. The demodulator according to claim 5, wherein the predetermined decimation ratio is a 1:32 ratio.

9. The demodulator according to claim 1, further comprising:
   a multiplier positioned before the decimator and integrator demodulator.

10. The demodulator according to claim 9, wherein the demodulator and the input filter are tuned to the carrier frequency of the input signal and the output filter is tuned to a decimated carrier frequency.

* * * * *